United States Patent
Faig Palomer

(10) Patent No.: US 9,380,731 B2
(45) Date of Patent: Jun. 28, 2016

(54) SYSTEM FOR AIR-CONDITIONING THE INTERIOR OF A DATA PROCESSING CENTER

(75) Inventor: Marc Faig Palomer, Palleja (ES)

(73) Assignee: AST MODULAR, S.L., Cornella de Llobregat (ES)

( * ) Notice: Subject to any disclaimer, the term of this patent is extended or adjusted under 35 U.S.C. 154(b) by 648 days.

(21) Appl. No.: 13/638,458

(22) PCT Filed: Mar. 31, 2010

(86) PCT No.: PCT/ES2010/000136
§ 371 (c)(1),
(2), (4) Date: Dec. 5, 2012

(87) PCT Pub. No.: WO2011/121141
PCT Pub. Date: Oct. 6, 2011

(65) Prior Publication Data
US 2013/0081784 A1    Apr. 4, 2013

(30) Foreign Application Priority Data
Mar. 30, 2010    (ES) .................................. 201030478

(51) Int. Cl.
*F25D 17/04*    (2006.01)
*H05K 7/20*    (2006.01)
*F24F 6/00*    (2006.01)
*H05K 7/14*    (2006.01)

(52) U.S. Cl.
CPC .............. *H05K 7/20163* (2013.01); *F24F 6/00* (2013.01); *H05K 7/1497* (2013.01); *H05K 7/202* (2013.01); *H05K 7/2059* (2013.01); *H05K 7/20745* (2013.01)

(58) Field of Classification Search
CPC . H05K 7/20163; H05K 7/1497; H05K 7/202; H05K 7/2059; H05K 7/20745; F25D 15/00
USPC ............ 62/118, 259.2, 413; 165/50, 67, 80.2, 165/96, 104.13, 104.25, 104.31, 104.34
See application file for complete search history.

(56) References Cited

U.S. PATENT DOCUMENTS

| 2,557,042 | A * | 6/1951 | Woolley ...................... 126/113 |
| 6,374,627 | B1 * | 4/2002 | Schumacher ........ H05K 7/2079 165/104.33 |
| 7,646,590 | B1 | 1/2010 | Corhodzic et al. |
| 8,151,578 | B1 * | 4/2012 | Morales ................ F24F 3/0442 62/259.2 |
| 2001/0052412 | A1 * | 12/2001 | Tikka ...................... H05K 7/206 165/299 |
| 2002/0134544 | A1 * | 9/2002 | DeVilbiss et al. ............ 165/287 |
| 2003/0050003 | A1 * | 3/2003 | Charron ................ F24F 3/0442 454/184 |
| 2005/0225936 | A1 * | 10/2005 | Day ................... H05K 7/20745 361/679.47 |
| 2008/0094797 | A1 * | 4/2008 | Coglitore ........... H05K 7/20745 361/679.5 |

(Continued)

OTHER PUBLICATIONS

International Search Report for International Application No. PCT/ES2010/000136 mailed Dec. 17, 2010.

*Primary Examiner* — Emmanuel Duke
(74) *Attorney, Agent, or Firm* — Merchant & Gould P.C.

(57) ABSTRACT

Environment conditioning system of the inner space of a data center (2) is provided with electronic equipment (3). The system (1) includes a passive air-to-air heat exchanger (4), configured to enable heat exchange, without air cross-contamination, between an outer air flow (5) and a recirculation air flow (6). The recirculation air flow (6) comes from the inner space of a data center (2) and it is intended to condition it after passing through the air-to-air heat exchanger (4).

12 Claims, 13 Drawing Sheets

(56) References Cited

U.S. PATENT DOCUMENTS

| | | | | |
|---|---|---|---|---|
| 2008/0123288 A1* | 5/2008 | Hillis | | H05K 7/20745 361/679.34 |
| 2009/0073652 A1* | 3/2009 | Matser | | H05K 7/20745 361/691 |
| 2009/0241578 A1 | 10/2009 | Carlson | | |
| 2009/0244829 A1 | 10/2009 | Weber et al. | | |
| 2009/0301123 A1* | 12/2009 | Monk | | F24F 11/0001 62/259.2 |
| 2010/0027216 A1 | 2/2010 | Matsushima | | |
| 2010/0165565 A1* | 7/2010 | Hellriegal | | G06F 1/183 361/679.46 |
| 2010/0170277 A1* | 7/2010 | Schmitt | | H05K 7/20745 62/259.2 |

\* cited by examiner

SYSTEM FOR AIR-CONDITIONING THE INTERIOR OF A DATA PROCESSING CENTER

This application is a National Stage Application of PCT/ES2010/000136, filed 31 Mar. 2010, which claims benefit of Serial No. P 201030478, filed 30 Mar. 2010 in Spain and which applications are incorporated herein by reference. To the extent appropriate, a claim of priority is made to each of the above disclosed applications.

OBJECT OF THE INVENTION

The present invention refers to a high energy efficiency system for air conditioning the inner space of a data centre.

The present invention is particularly suitable for its application in data centres formed by independent containers, mixed or compact containers, industrial units or any other type of building enabled for them.

BACKGROUND OF THE INVENTION

Data centres are formed by large rooms or buildings, inside of which there is an important number of electronic equipment intended to process the information of a particular company or organization. This type of centres requires high energy consumption, which is currently divided into approximately the following way: electronic equipment 38%-63%, air conditioning 23%-54%, uninterrupted power supply (UPS) 6%-13% and lighting 1%-2%, among other less important facilities. Besides, it is estimated that cost associated to said energy consumption increases annually between 10% and 25%.

The consumption corresponding to air conditioning equipment is particularly significant, since it has great influence on the PUE (Power Usage Effectiveness) coefficient. This coefficient is expressed as the relation between the energy intended to data processing and the total energy consumed by the data centre. The closer to 1 the value of said coefficient is, the greater the harnessing of the energy consumed by the data centre will be. However, the consumption intended for air conditioning equipment often considerably penalizes the PUE value. For example, mean PUE values can be found close to 1.05, when refrigeration systems are used through natural ventilation, close to 1.6 in newly installed data centres using conventional refrigeration systems, such as refrigerant gas-air, water-air, and up to 2.5 and 3 in existing data centres with this type of systems. Other coefficients which are also negatively affected by more conventional refrigeration systems are CAPEX and OPEX. The former refers to capital expenditures, while the latter refers to operation expenditures.

Nowadays, therefore, there exists a growing interest in reducing the consumption of data centre conditioning systems. In this sense, there are known the following solutions.

The first of them consists of the use of systems based on direct natural ventilation of data centres, which could be used to obtain PUE values very close to 1. However, this solution has multiple inconveniences.

First, there exists the air pollution problem. Specifically, the inner space conditions of a data centre are so demanding that they require the installation of air filters in order not to damage the electronic equipment and reduce their life. However, air filters produce a certain percentage of efficiency loss in the system, which increases progressively as they become dirty. Therefore, it is necessary to provide constant system maintenance and periodically substitute the dirty filters.

Another problem of natural ventilation systems is the lack of control of the relative humidity inside the inner space of the data centre, which according to existing regulations, such as ASHRAE, and to the requirements of electronic equipment manufacturers reaches adequate values close to 50%.

The high risk of water presence inside the data centre is also one of the important problems of natural ventilation systems. Water is a critical element in a data centre, being very harmful to electronic equipment and the correct operation thereof. Natural ventilation requires openings which communicate the outer space with inner space of data centres, which constitute a water access point. In order to avoid these undesired infiltrations, there are often used filters, pent roofs or even external covers, or other buildings or industrial units inside of which the data centre is located.

Finally, another problem of natural ventilation is that it can only be applied in certain geographical areas, where outside temperatures are low enough all year round for the correct operation of the data centre. Thus, natural ventilation systems normally form part in many occasions of mixed systems, that is, systems which combine natural ventilation with conventional air conditioning facilities, to enable the application of a greater number of geographical areas.

Another one of the solutions known to reduce the consumption of environment conditioning systems of data centres can be found in EP1903849A1. This document shows an environment conditioning system of the inner space of a data centre which uses a rotating air-to-air heat exchanger, configured to facilitate heat exchange between an outer air flow and a recirculation air flow coming from the inner space of the data centre. This type of exchangers is usually formed by a large rotating cylinder constituted by metal plates of great density. Its operation is based on the thermal inertia of the materials constituting it, so that they absorb and retain the heat of the recirculation air flow and transfer it to the outer air flow as the cylinder rotation takes place. This solution also has multiple inconveniences.

First, said solution does not guarantee 100% the presence of cross-contamination between the aforementioned flows. Although it can be seen that the exchanger is located between two separated air chambers, being half of it in each one of them, there exists no possible separation along its diameter length and width. Therefore, the pressure differences between both flows always produce a cross-contamination minimum. For the same reason, it cannot be guaranteed the absence of water coming from the condensation on metal plates, which passes to the recirculation air flow, and it is not possible to carry out a thorough control of the relative humidity of the inner environment.

However, the greater inconveniences of this system are the need to maintain the exchanger continuously moving and the important energy consumption required by the engine configured to that end, taking into account the great weight and volume of these exchangers. The first of these inconveniences forces to have similar redundant auxiliary measures which guarantee the continuity of the operation, so necessary in data centres. In this sense, it is necessary to have at least one back-up engine and dual power supply intended to produce the movement. On the other hand, the second of these inconveniences directly affects the system energy efficiency, since the engine consumption and its associated components have a negative effect on the PUE.

The high energy efficiency system for the air conditioning of the inner space of a data centre of the present invention solves the aforementioned problems in a fully satisfactory manner. Specifically, the system of the present invention uses a passive air-to-air heat exchanger, free of moving elements, configured to allow heat exchange, without air cross-contamination, between the outer air flow and the recirculation air flow. Wherein said system also enables the recovery of heat dissipated by data processing electronic equipment for its later harnessing, and it is also complemented by other elements which allow the system operation in a wide range of geographical areas with very different climates.

DESCRIPTION OF THE INVENTION

In order to solve the aforementioned problems, the system for air conditioning the inner space of a data centre provided with electronic equipment of the present invention comprises a passive air-to-air heat exchanger, configured to allow heat exchange, without air cross-contamination, between the outer air flow and the recirculation air flow, wherein said recirculation air flow comes from the inner space of the data centre and it is intended to condition it after passing through the air-to-air heat exchanger. Said conditioning is intended to guarantee an inner environment of the data centre with the most suitable relative temperature and humidity values for the correct operation thereof.

Preferably, the air-to-air heat exchanger is of the heat pipe or tube heat type. This type of exchangers is generally formed by a frame comprising a plurality of closed pipes in a parallel arrangement. In turn, the inside of each one of those pipes comprises a fluid at an appropriate pressure which allows its evaporation and condensation within a specific temperature range. The end or the part of the exchanger where the fluid condensation is produced causes the heat release, while the end or the part of the exchanger where the fluid evaporation is produced causes the heat absorption. Thus, this type of exchanger does not require mobile elements for its correct performance, that is, it is static, unlike rotating exchangers, so that it does not causes any electrical consumption, besides control and measurement elements which could be associated thereto.

Another type of passive exchangers which can be used is the so called plate heat exchanger. They are formed by a plurality of metal plates in a parallel arrangement, with high thermal inertia, between which the heat of two air flows perpendicular to each other is exchanged, without there appearing any air cross contamination between them.

The recirculation air flow is directly extracted from one or more hot corridors where the heat generated by the electronic equipment is dissipated, and it is also directly inserted, after passing through the air-to-air heat exchanger, in one or more cold corridors to condition the environment inside them. The heat and cold corridors are duly separated in order to avoid the mixing of the air present in them. The extraction and insertion are directly carried out, that is, without using ducts or with the least number thereof, either naturally or by force.

Additionally, the system of the present invention comprises an alternative circuit, or by-pass, to the passage through the air-to-air exchanger, configured to divert in a controlled manner the energy recovery air flow from the inner space in order to harness the heat surplus thereof. This is carried out in order to harness the high heat released from the electronic equipment, heating either other type of areas close to the data centre or sanitary hot water circuits, among other harnessing forms. However, one of the main applications of this alternative circuit consists of mixing the energy recovery air flow with the recirculation air flow at the outlet of the air-to-air heat exchanger, before its insertion in the inner space. This enables to implement the system of the present invention in data centres located in geographical areas with very low temperatures. All of the aforementioned is carried out in a controlled manner, that is, with the control and measurement elements necessary to regulate the accurate energy recovery air flow rate at every moment.

The system of the present invention also comprises refrigeration means which absorb part of the thermal energy of the recirculation air flow, before its insertion in the inner space. Said means comprise one or more evaporators of the refrigerating gas-air type or water-air heat exchangers, arranged in order to provide an additional refrigerating load to the recirculation air flow. The exchangers comprise hydraulic circuits connected to the corresponding refrigerating equipments, located outside or inside the data centre. This accessory is particularly useful for its application in data centres located in geographical areas with very high temperatures.

Additionally, the system of the present invention comprises first humidification means configured to control the relative humidity of the recirculation air flow before its insertion in the inner space, in order to guarantee the appropriate relative humidity conditions thereof.

Besides, the system of the present invention also comprises second humidification means configured to control the relative humidity of the outside air flow before its passage through the air-to-air heat exchanger, mainly in order to reduce the dry inlet temperature thereof. Preferably, this accessory is also accompanied by the refrigeration module described above, which is particularly useful for its application in data centres located in geographical areas with very high temperatures.

Preferably, the first and second humidification means are of the evaporating type, in order to avoid the presence of water inside the data centre. Preferably, said means comprise a pressurization group connected to one or more deposits which pulverize in a controlled manner the water thereof by means of two independent circuits. One is for the outer air flow and the other is for the recirculation air flow.

As it was stated above, the present invention is particularly suitable for its application in data centres formed by independent containers, mixed or compact containers, industrial units or any other type of building enabled for them. Therefore, according to the type of data centre in which the system of the present invention is implemented, different construction variants can be carried out, as it is explained below.

Preferably, the construction variants of the system of the present invention have in common an air-to-air heat exchanger comprising:
    a first part through which the outer air flow circulates; and
    a second part through which the recirculation air flow circulates.

Both the first and second parts are located in areas separated by enclosures to avoid cross-contamination between the outer air flow and the recirculation air flow. It is a separation for volumetric purposes, in order to isolate the air flow circulating through each one of the parts of the exchanger preventing cross-contamination.

According to a first constructive variant, specially suitable for data centers of the independent container type, the system of the present invention comprises at least one air-to-air heat exchanger in vertical position which is located inside a container configured to be placed on the upper part of the data centre, said container in turn comprises:
    an upper area, where there is a first part of the air-to-air heat exchanger, provided with side external openings configured to enable the inlet and outlet of the outer air flow; and a lower area, where the second part of the air-to-air heat exchanger is located, provided with the horizontal interior openings configured to enable the inlet and outlet of the recirculation air flow.

The side external openings can be constituted with or without grids, with or without mouths or inlet and outlet ducts for the outer air flow, with or without forced ventilation equipment, etc. The horizontal interior openings will preferably comprise grids and air forced extraction/impulsion equipment.

According to a second constructive variant, the system of the present invention comprises an air-to-air heat exchanger in vertical position, where:
the first part is inside an outer module provided with side external openings configured to enable the inlet and outlet of the outer air flow; and
the second part is located within a closed site, provided with the vertical interior openings configured to enable the inlet and outlet of recirculation air flow.
According to a third constructive variant:
the outer module is on top of the closed site; and
the closed site is adjacent to the data centre.
In turn, the first part of the air-to-air heat exchanger is arranged in vertical situation with respect to the second part thereof.
According to a fourth constructive variant:
the closed site is located between the outer module and the data centre.
In turn, the first part of the air-to-air heat exchanger is arranged in horizontal situation with respect to the second part thereof.

The preceding variants are shown as non-limiting examples of embodiments of the present invention.

BRIEF DESCRIPTION OF THE DRAWINGS

The following is a brief description of a series of drawings which will help understand the invention better, clearly relating to different embodiments of said invention which are presented as non-limiting examples thereof.

PREFERRED EMBODIMENT OF THE INVENTION

Figure 1:
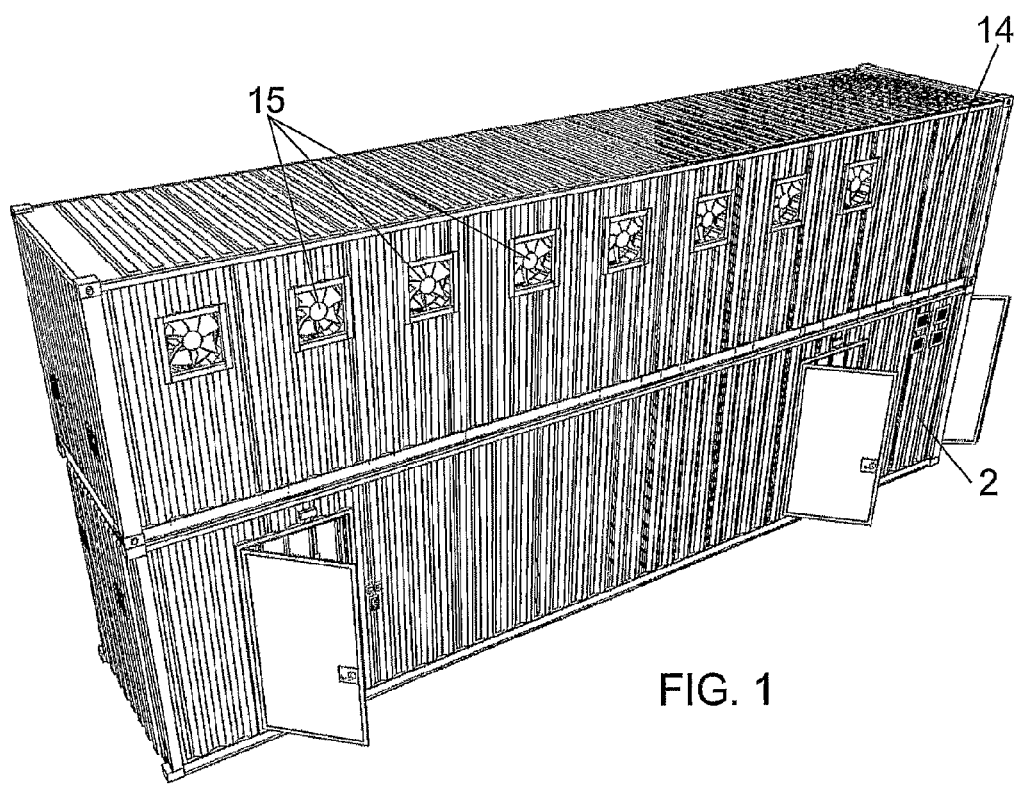
FIG. 1 represents a perspective view of a data centre of the independent container type, provided with the system of the present invention, according to a first preferred embodiment.

FIG. 1 represents a perspective view of a data centre of the independent container type, provided with the system (1) of the present invention, according to a first preferred embodiment.

Figure 2:
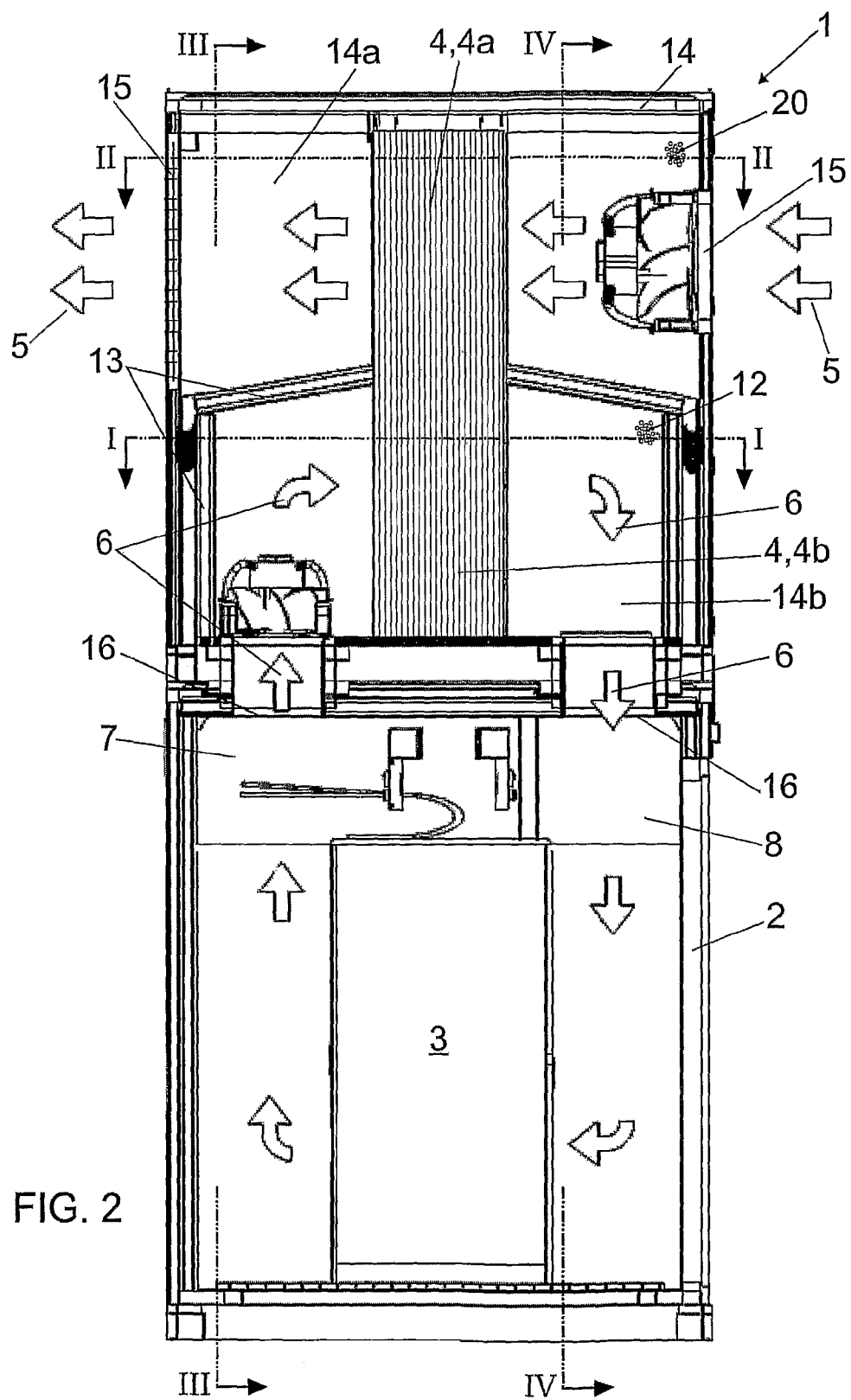
FIG. 2 shows a first profile section of the data centre of FIG. 1.

FIG. 2 shows a first profile section of the data centre of FIG. 1. In said figure it can be seen a system (1) for air conditioning the inner space of a data centre (2) provided with electronic equipment (3). Said system (1) comprises a passive air-to-air heat exchanger (4), of the heat pipe type or heat tube type, configured to allow heat exchange, without air cross-contamination, between an outer air flow (5) and a recirculation air flow (6), where said recirculation air flow (6) comes from the inner space of a data centre (2) and is intended to condition it after passing through the air-to-air heat exchanger (4).

As it can be seen, the recirculation air flow (6) is directly extracted from one or more hot corridors (7) in which the heat generated by electronic equipment (3) is dissipated, and is also directly inserted, after passing through the air-to-air heat exchanger (4), into one or more cold corridors (8) to condition the environment inside them.

Figure 3:
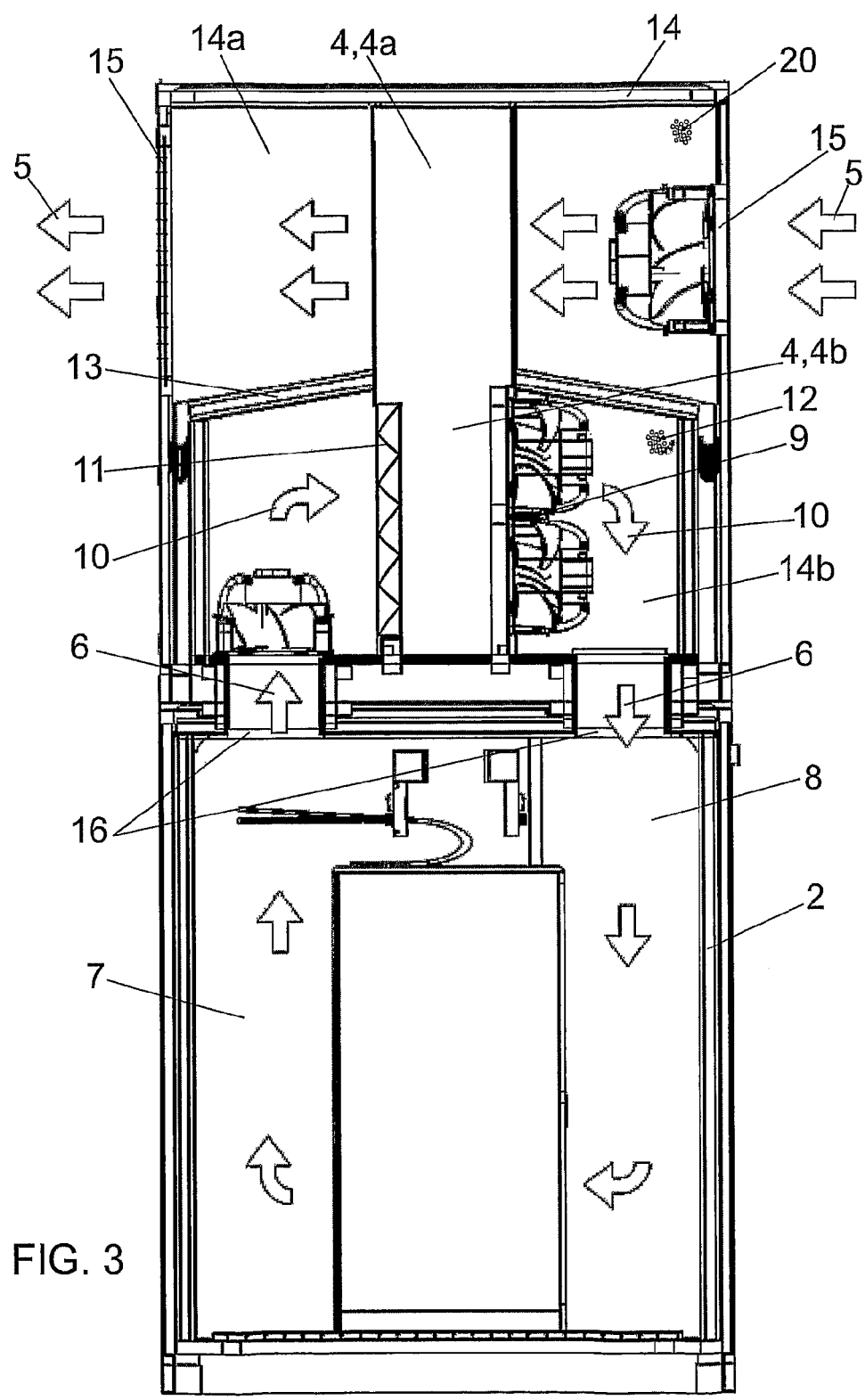
FIG. 3 shows a second profile section of the data centre of FIG. 1.

FIG. 3 represents a second profile section of the data centre of FIG. 1, in which an alternative circuit (9), or by-pass, can be seen at the passage through the air-to-air exchanger (4), configured to deviate in a controlled manner an air flow from energy recovery (10) coming from the inner space to harness the heat surplus from it, mixing it with the recirculation air flow (6) at the outlet of the air-to-air heat exchanger (4), before its insertion in the inner space.

The system of the present invention comprises complementary refrigeration means (11) which absorb part of the thermal energy of the recirculation air flow (6), before its insertion in the inner space.

The system of the present invention comprises humidification means (12) configured to control the relative humidity of the recirculation air flow (6) before its entering the inner space, in order to guarantee suitable humidity conditions relative to it. The system of the present invention also comprises second humidification means (20) configured to reduce the dry inlet temperature of the outer air flow (5) before its passage through the air-to-air heat exchanger (4).

Figure 4:
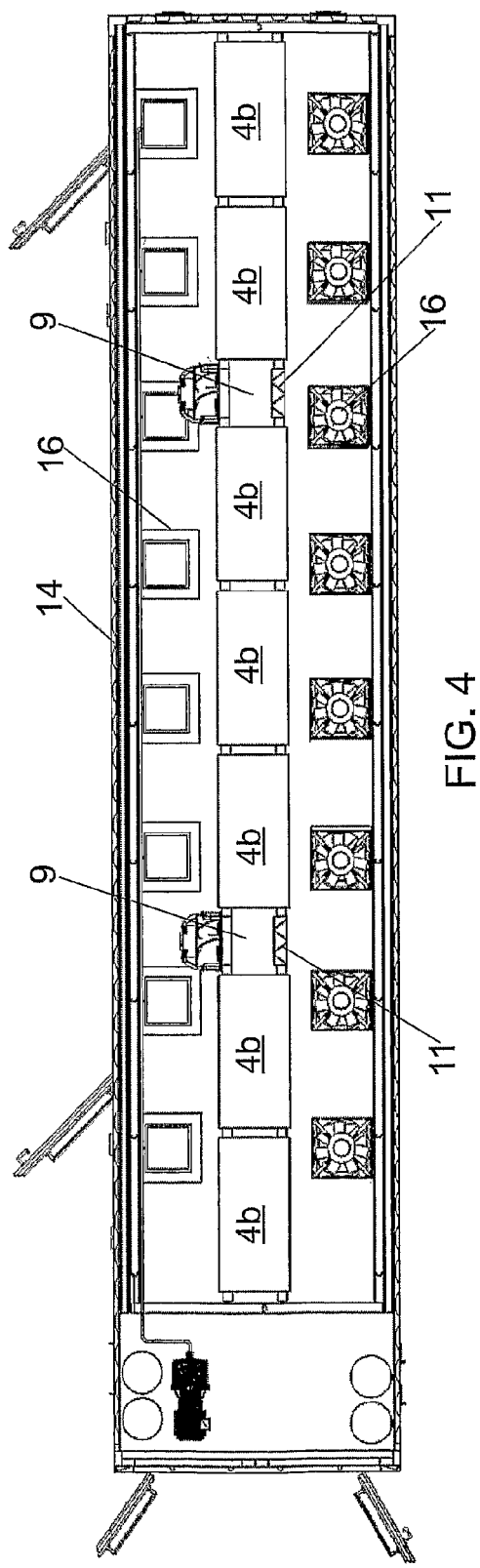
FIG. 4 shows a plan sectional view according to the cutting plane I-I of FIG. 2.
Figure 5:
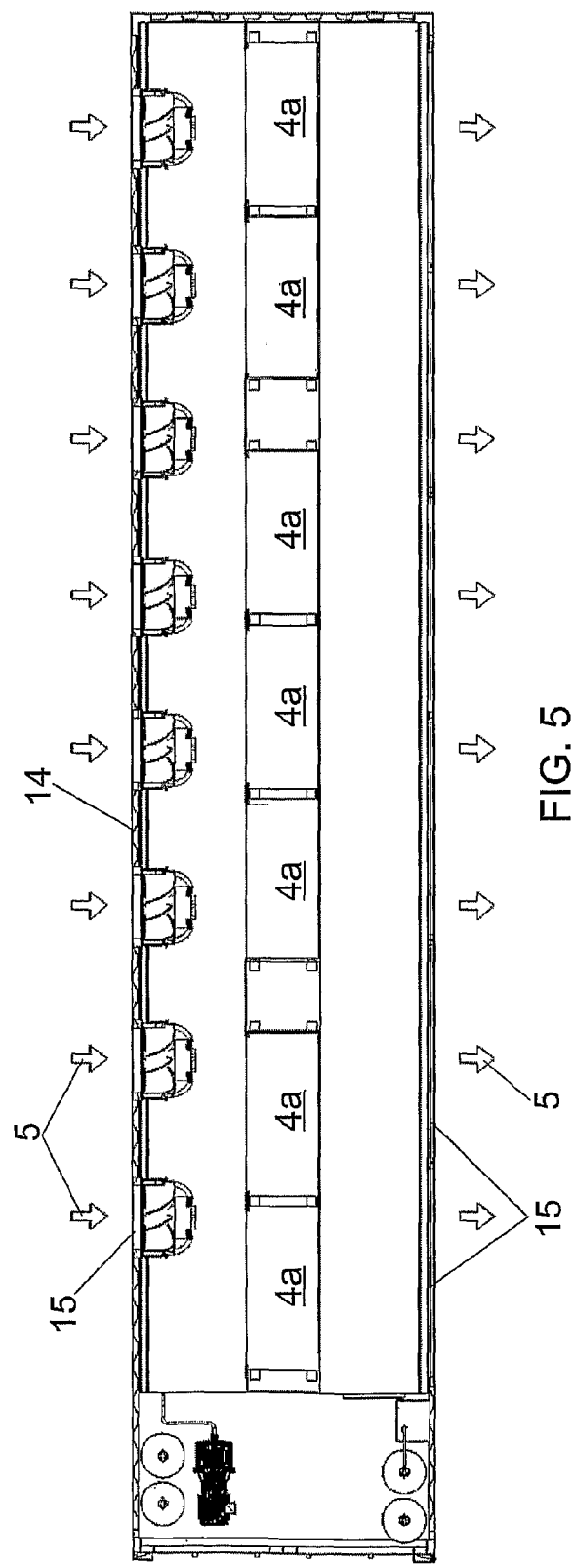
FIG. 5 shows a plan sectional view according to the cutting plane II-II of FIG. 2.

FIGS. 4 and 5 represent a plan sectional view of the cutting plane I-I and according to the cutting plane II-II of FIG. 2 respectively. Said figures show the plan distribution of the elements constituting the system (1) of the present invention according to this first preferred embodiment.

As it was indicated above, the constructive variants of the system of the present invention have in common an air-to-air heat exchanger (4) comprising:
a first part (4a) through which the outer air flow (5) circulates; and
a second part (4b) through which the recirculation air flow (6) circulates;
where both the first (4a) and second parts (4b) are located in spaces separated by enclosures (13) in order to avoid cross-contamination between the outer air flow (5) and recirculation air flow (6).

According to a first constructive variant, the system of the present invention comprises at least one air-to-air heat exchanger (4) in vertical position which is located inside a container (14) configured to be placed on the upper part of the data centre (2), said container (14) in turn comprising:

an upper area (14a), where the first part of the air-to-air heat exchanger (4a) is located, provided with side external openings (15) configured to enable the inlet and outlet of the outer air flow (5); and a lower area (14b), where the second part of the air-to-air heat exchanger (4b) is located, provided with the horizontal interior openings (16) configured to enable the inlet and outlet of the recirculation air flow (6).

Figure 6:
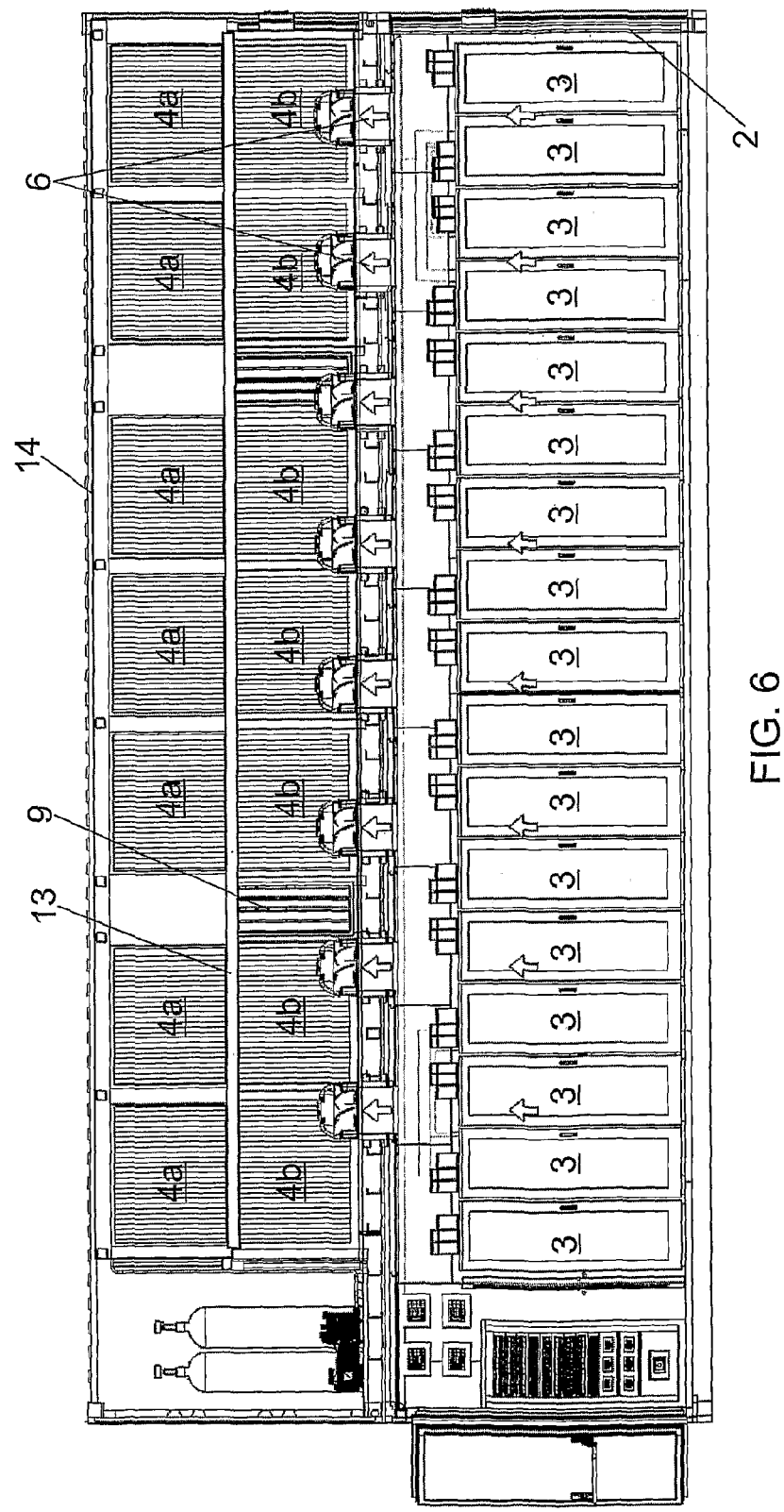
FIG. 6 shows an elevated sectional view according to the cutting plane III-III of FIG. 2.
Figure 7:
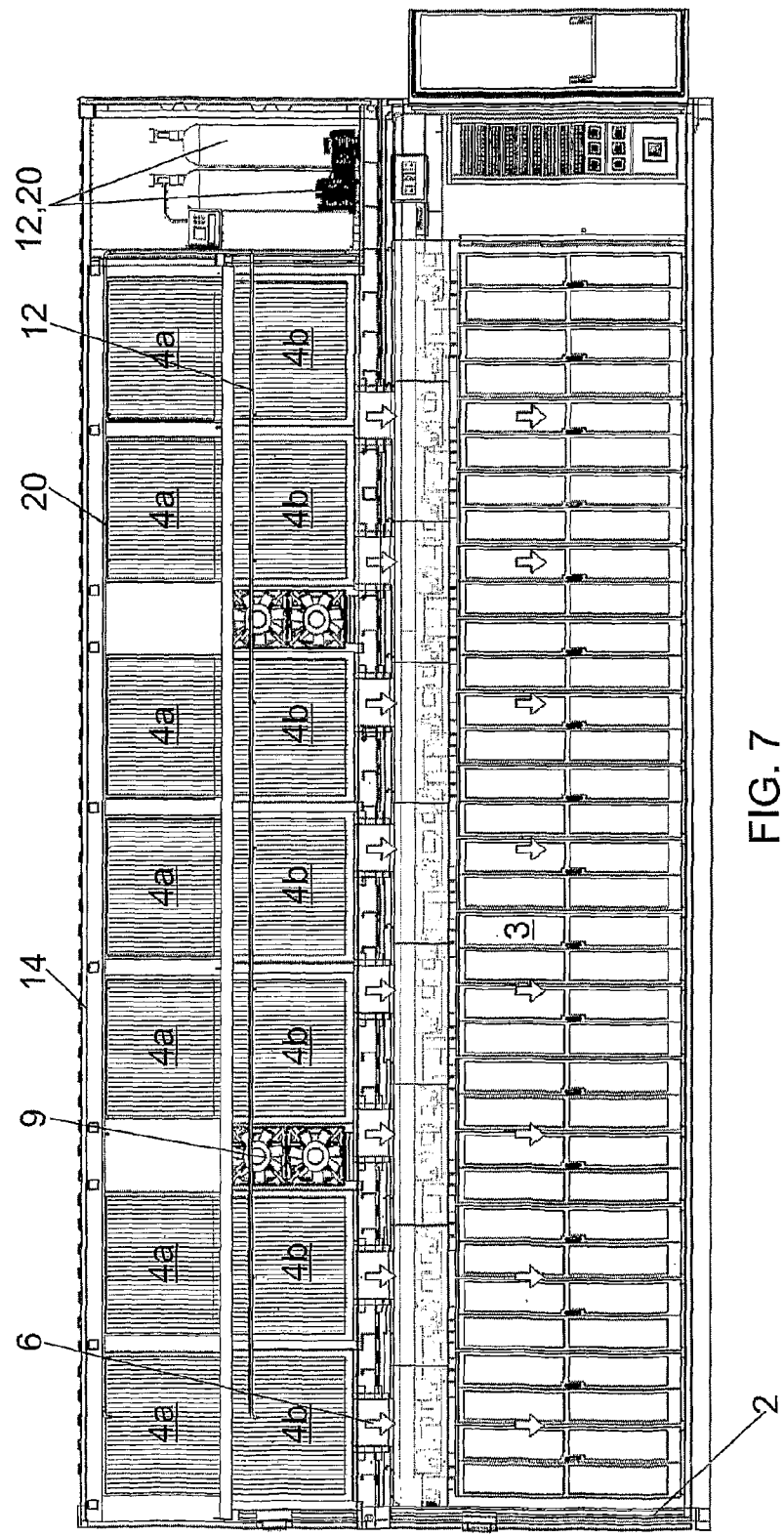
FIG. 7 shows an elevated sectional view according to the cutting plane IV-IV of FIG. 2.

FIGS. 6 and 7 represent an elevated sectional view according to the cutting plane III-III and according to the cutting plane IV-IV of FIG. 2 respectively. Said figures show the elevated distribution of the elements constituting the system (1) of the present invention according to this first preferred embodiment.

Figure 8:
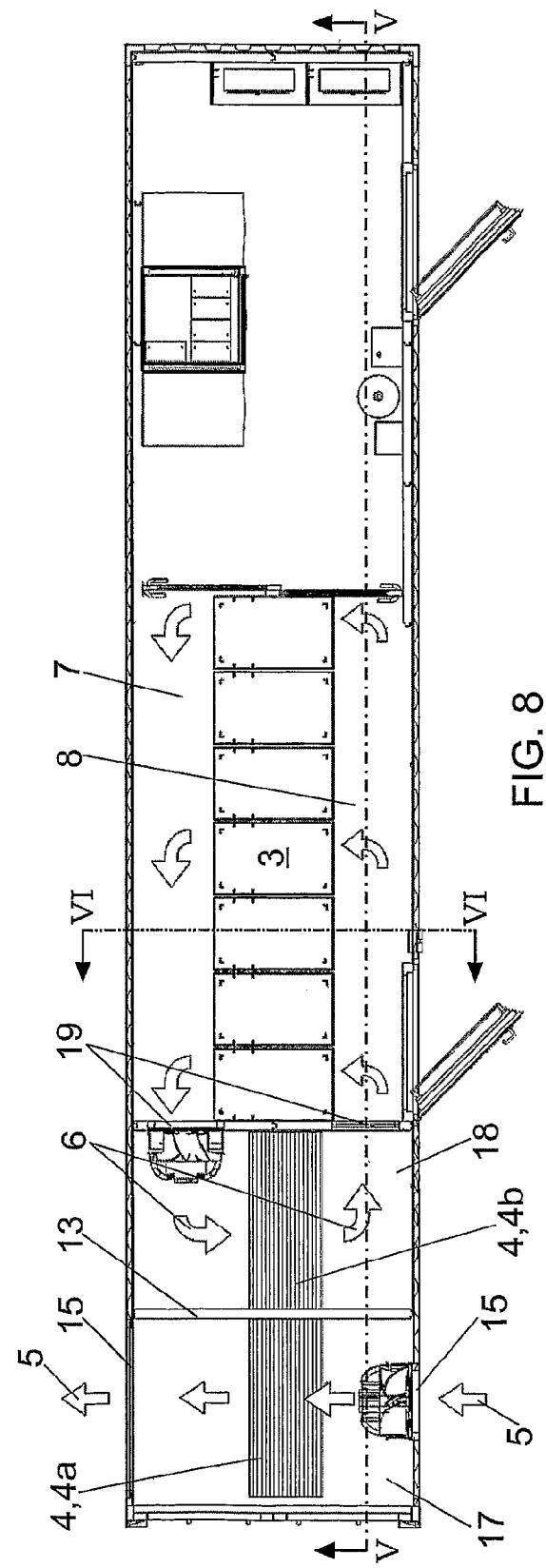
FIG. 8 represents a sectional plan view of a data centre of the independent container type, provided with the system of the present invention, according to a second preferred embodiment.

FIG. 8 represents a sectional plan view of a data centre, of the independent container type, provided with the system (1) of the present invention, according to a second preferred embodiment. Said figure shows an air-to-air heat exchanger (4) in vertical position, where:

the first part (4a) is inside an outer module (17) provided with side external openings (15) configured to enable the inlet and outlet of the outer air flow (5); and the second part (4b) is located within a closed site (18), provided with the vertical interior openings (19) configured to enable the inlet and outlet of recirculation air flow (6).

According to this second preferred embodiment, the closed site (18) is located between the outer module (17) and the data centre (2), so that the first part (4a) of the air-to-air heat exchanger (4) is arranged in horizontal situation with respect to the second part (4b) thereof.

Figure 9:
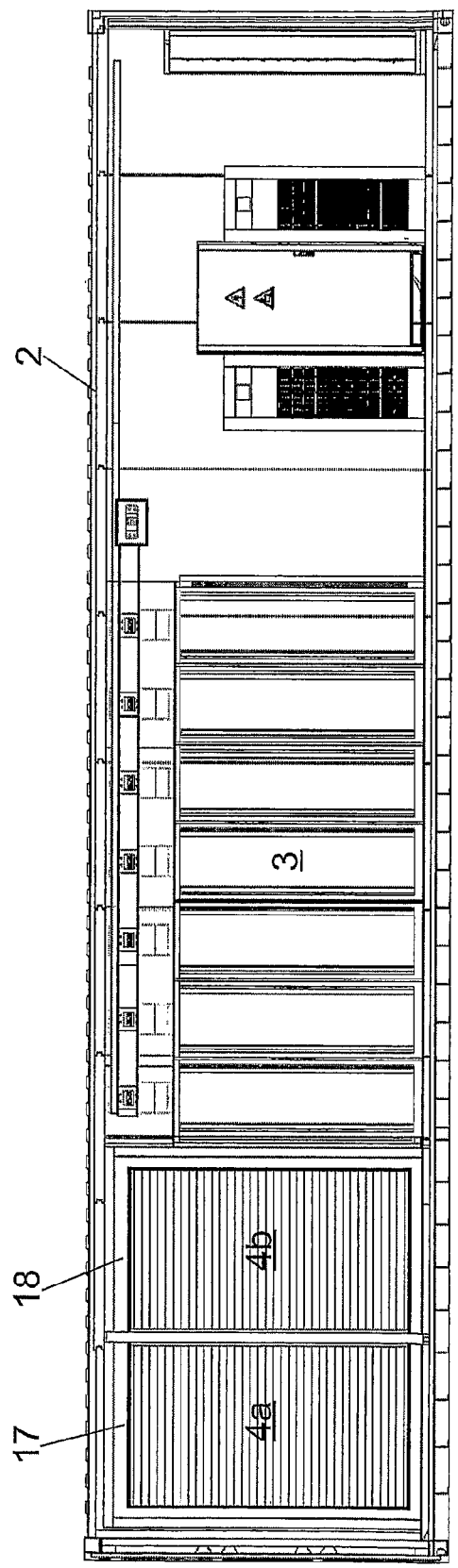
FIG. 9 shows an elevated sectional view according to the cutting plane V-V of FIG. 8.
Figure 10:
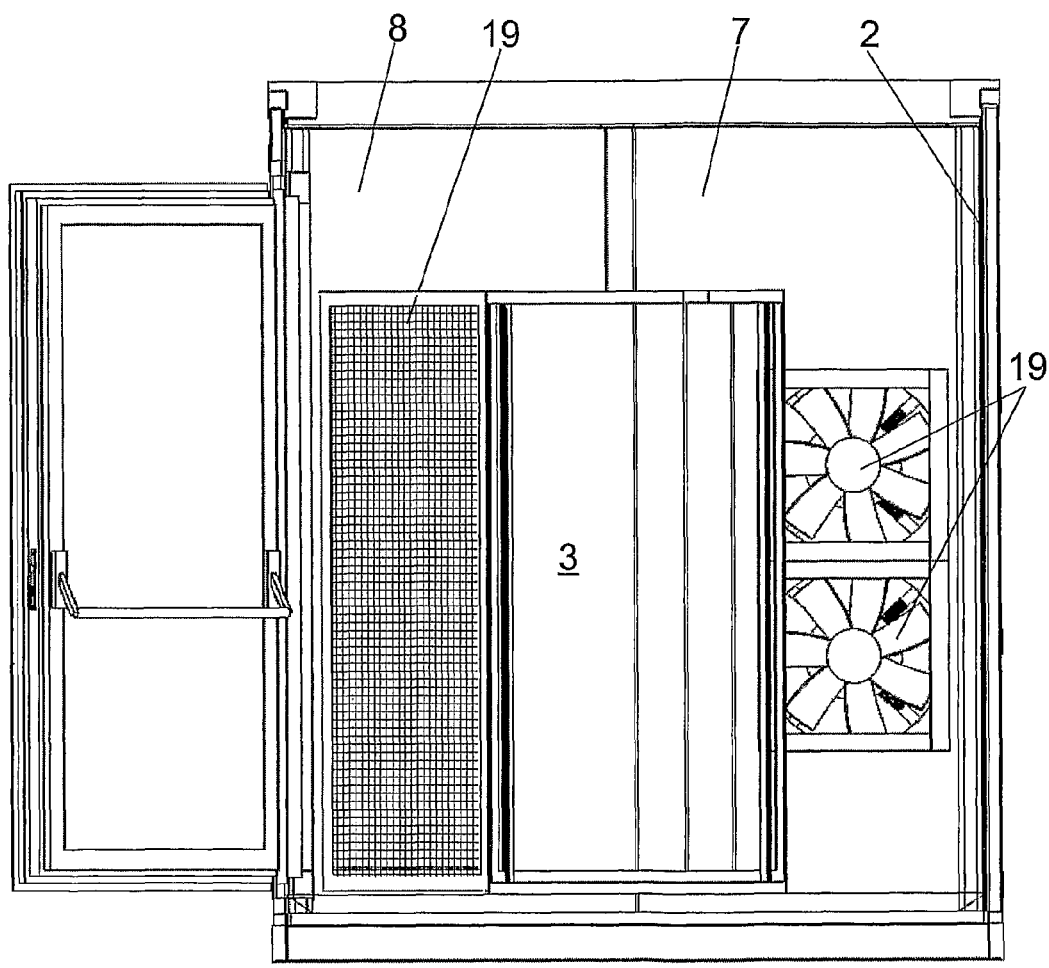
FIG. 10 shows a profile sectional view according to the cutting plane VI-VI of FIG. 8.

FIGS. 9 and 10 represent an elevated sectional view according to the cutting plane V-V and a profile section according to the cutting plane VI-VI of FIG. 8 respectively. Said figures show the elevated distribution and profile of the elements constituting the system (1) of the present invention according to this second preferred embodiment.

Figure 11:
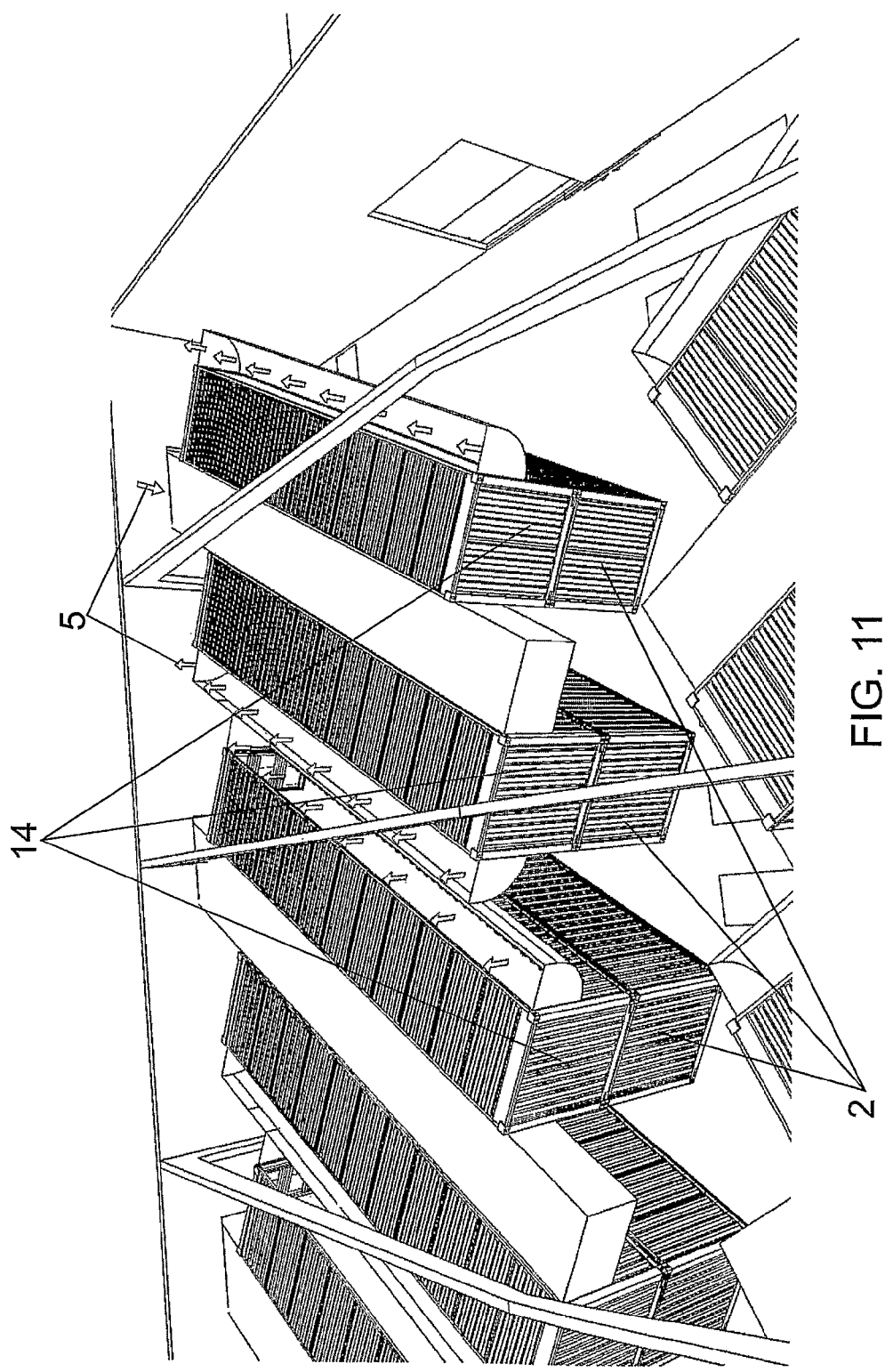
FIG. 11 represents a perspective view of a data centre formed by independent containers located inside an industrial unit, provided with the system of the present invention.

FIG. 11 represents a perspective view of a data centre formed by independent containers located inside an industrial unit. Said figure shows an example of the location of a plurality of data centres (2), of the container type, with their respective environment conditioning systems (1). The outer air (5) supply and its extraction, after passing through the air-to-air exchanger (4), is carried out in such a way that the outer air (5) inlet and outlet flow do not short-circuit. This example is also designed to be able to control the outer air flow (5) passing through the different data centres (2).

Figure 12:
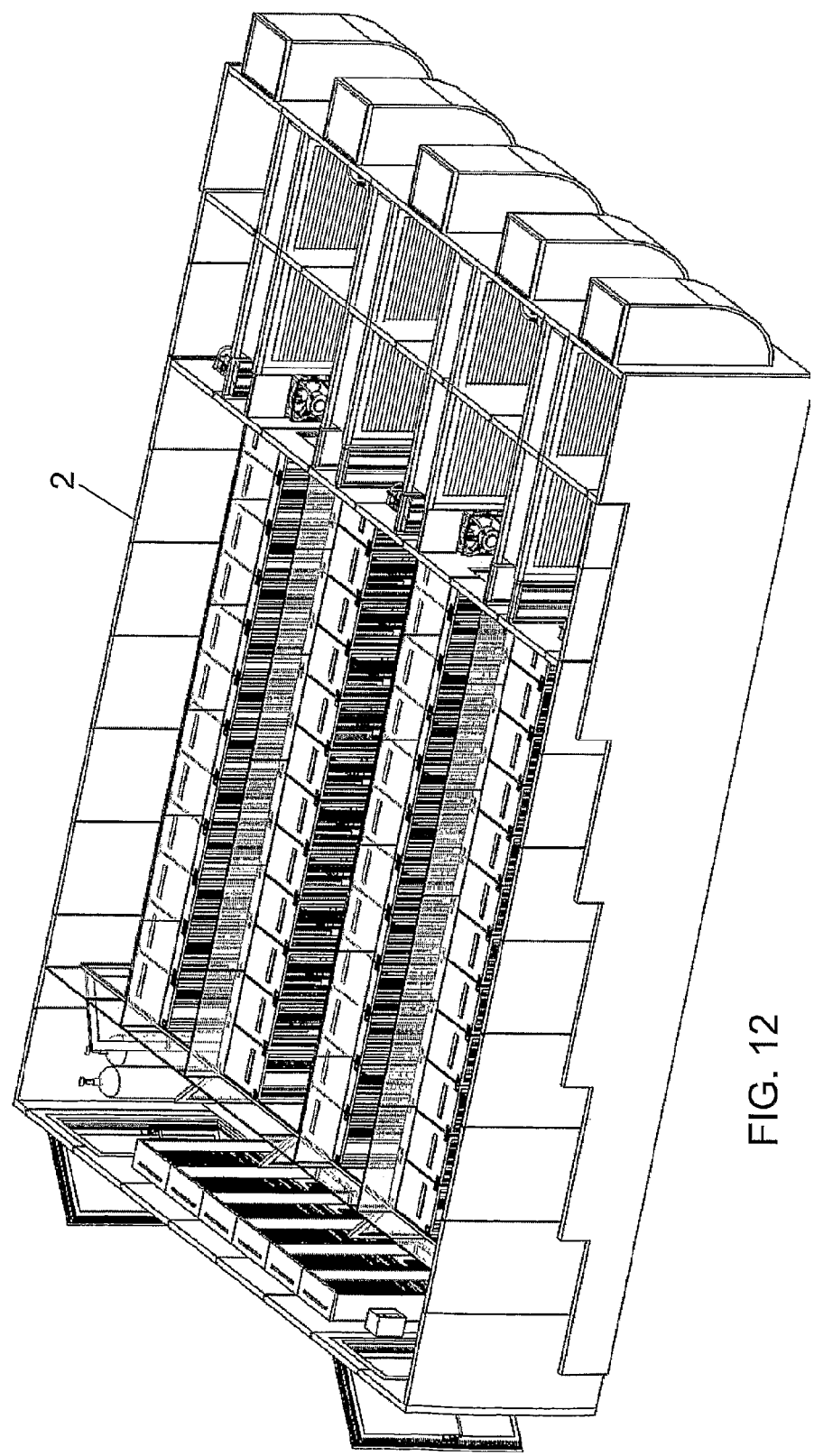
FIG. 12 represents a perspective view of a data centre integrated in a building, provided with the system of the present invention.

FIG. 12 represents a perspective view of a data centre integrated in a building, which incorporates the system of the present invention.

Figure 13:
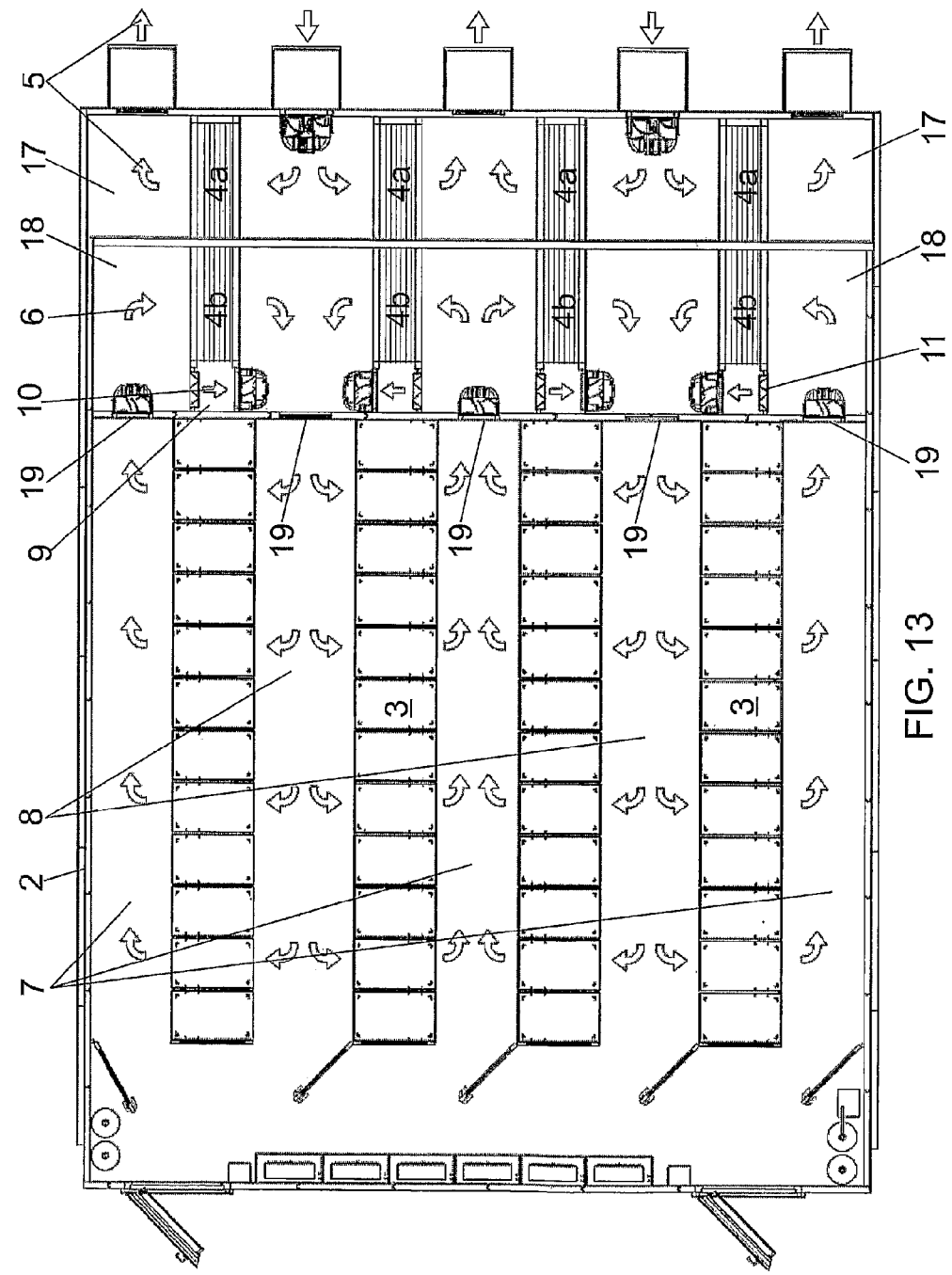
FIG. 13 shows a sectional plan view of the data centre of FIG. 12.

FIG. 13 represents a plan sectional view of the data centre of FIG. 12.

The invention claimed is:

1. An environment conditioning system of an inner space of a data centre provided with electronic equipment, said system comprising:

a static heat pipe air-to-air heat exchanger configured to facilitate heat exchange and to maintain separation without air cross-contamination, between an outer air flow and a recirculation air flow, wherein said recirculation air flow comes from the inner space of the data centre, the recirculation air flow being conditioned after passing through the air-to-air heat exchanger;

an area comprising:

a first part including a first portion of the air-to-air heat exchanger and the outer flow;

a second part separate and closed from the first part of the area, the second part of the area including a second portion of the air-to-air heat exchanger and the recirculation air flow;

a refrigeration apparatus in the second part of the area for absorbing part of thermal energy of the recirculation air flow, before insertion of the recirculation air flow in the inner space; and a humidification apparatus in the second part of the area configured for controlling relative humidity of the recirculation air flow before insertion of the recirculation air flow in the inner space.

2. The environment conditioning system of the inner space of the data centre according to claim 1, wherein the recirculation air flow is directly extracted from one or more hot corridors in which heat generated by the electronic equipment is dissipated.

3. The environment conditioning system of the inner space of the data centre according to claim 1, wherein the recirculation air flow is directly inserted, after passage through the air-to-air heat exchanger, in one or more cold corridors to condition the environment inside the cold corridors.

4. The environment conditioning system of the inner space of the data centre according to claim 1, further comprising a by-pass circuit to a passage through the air-to-air exchanger in the second part of the area, configured to divert in a controlled manner an energy recovery air flow coming from the inner space to harness heat surplus thereof.

5. The environment conditioning system of the inner space of the data centre according to claim 4 wherein the energy recovery air flow is mixed with the recirculation air flow at the outlet of the air-to-air exchanger, before insertion in the inner space.

6. The environment conditioning system of the inner space of the data centre according to claim 1, further comprising a second humidification apparatus in the first part of the area configured for controlling relative humidity of the outer air flow before passage through the air-to-air heat exchanger.

7. The environment conditioning system of the inner space of the data centre according to claim 1, wherein both the first portion of the air-to-air heat exchanger and the second portion of the air-to-air heat exchanger are located in spaces separated by enclosures in a container in order to avoid cross-contamination between the outer air flow and the recirculation air flow.

8. The environment conditioning system of the inner space of the data centre according to claim 7, wherein the air-to-air heat exchanger is in a vertical position which is inside the container configured to be placed on an upper part of the data centre, said container comprising:

an upper area including the first part of the container and the first portion of the air-to-air heat exchanger, provided with side external openings configured to enable the inlet and outlet of the outer air flow; and a lower area including the second part of the container and the second portion of the air-to-air heat exchanger, provided with the horizontal interior openings configured to enable the inlet and outlet of recirculation air flow.

9. The environment conditioning system of the inner space of the data centre according to claim 7, wherein the air-to-air heat exchanger is in a vertical position, wherein:

the first portion is inside an outer module provided with side external openings configured to enable the inlet and outlet of the outer air flow; and the second portion is located within a closed site, provided with the vertical interior openings configured to enable the inlet and outlet of recirculation air flow.

10. The environment conditioning system of the inner space of the data centre according to claim 9 wherein:
the outer module is on top of the closed site; and
the closed site is located adjacent to the data centre;
wherein the first portion of the air-to-air heat exchanger is arranged vertically with respect to the second portion of the air-to-air heat exchanger.

11. The environment conditioning system of the inner space of the data centre according to claim 9 wherein:
the closed site is located between the outer module and the data centre;
wherein the first portion of the air-to-air heat exchanger is arranged horizontally with respect to the second part thereof.

12. Data centre comprising an environment conditioning system of the inner space thereof according to claim 1.

* * * * *